US006251726B1

United States Patent
Huang

(10) Patent No.: US 6,251,726 B1
(45) Date of Patent: Jun. 26, 2001

(54) METHOD FOR MAKING AN ENLARGED DRAM CAPACITOR USING AN ADDITIONAL POLYSILICON PLUG AS A CENTER PILLAR

(75) Inventor: Jenn Ming Huang, Hsin-Chu (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/489,495

(22) Filed: Jan. 21, 2000

(51) Int. Cl.[7] ............................................... H01L 21/336
(52) U.S. Cl. ..................... 438/253; 438/398; 438/719; 438/723; 438/395
(58) Field of Search ................................ 438/253, 386, 438/387, 396, 397, 398, 399, 691, 692, 719, 723, 724, 763, 766

(56) References Cited

U.S. PATENT DOCUMENTS

| | | | |
|---|---|---|---|
| 5,702,989 | 12/1997 | Wang et al. | 438/397 |
| 5,843,821 | 12/1998 | Tseng | 438/253 |
| 5,854,105 | 12/1998 | Tseng | 438/253 |
| 5,863,821 | 1/1999 | Chao | 438/253 |
| 5,888,865 | 3/1999 | Lin | 438/253 |
| 6,046,093 * | 4/2000 | DeBoer et al. | 438/397 |
| 6,069,038 * | 5/2000 | Hashimoto et al. | 438/396 |
| 6,077,742 * | 6/2000 | Chen et al. | 438/255 |
| 6,087,694 * | 7/2000 | Ohno et al. | 257/306 |
| 6,100,137 * | 8/2000 | Chen et al. | 438/396 |

* cited by examiner

Primary Examiner—Benjamin L. Utech
Assistant Examiner—Duy-Vu Deo
(74) Attorney, Agent, or Firm—George O. Saile; Stephen B. Ackerman

(57) ABSTRACT

A method is provided for making capacitors for future high density circuits. The method increases capacitance while reducing the difficulty in etching the high aspect ratio holes for the capacitor node contacts. After FETs are formed in device areas, a first insulator is deposited and first contact openings are etched for the capacitor node contact. First polysilicon (polySi) plugs are formed in the first contact openings. An etch-stop layer and a second insulating layer are deposited. Second contact openings are aligned over and etched in the second insulating layer to the first polySi plugs. Second polySi plugs are formed in the second contact openings. Openings for capacitors, aligned over and wider than the second polySi plug, are etched in the second insulating layer. The capacitors are completed by forming bottom electrodes with a thin dielectric layer in the capacitor openings and forming a top electrode. This two polysi plug method reduces the need to etch a single high aspect ratio (deep) contacts holes. The second polysi plug also serves as a pillar for increased capacitance. The second contact openings and capacitor openings are etched using a very controllable etch to the etch-stop layer without disturbing the underlying DRAM structure. This allows capacitor design changes for future product generation beyond 0.25 um.

21 Claims, 7 Drawing Sheets

METHOD FOR MAKING AN ENLARGED DRAM CAPACITOR USING AN ADDITIONAL POLYSILICON PLUG AS A CENTER PILLAR

BACKGROUND OF THE INVENTION (1) Field of the Invention

The present invention relates to the fabrication semiconductor integrated circuits, and more particularly to a method of fabricating random access memory (DRAM) devices, having stacked capacitors with an additional polysilicon plug to reduce the aspect ratio for capacitor node contact openings while increasing capacitance.

(2) Description of the Prior Art

Advances in Ultra Large Scale Integration (ULSI) technologies are dramatically increasing the circuit density on the semiconductor chip. This increase in density is due in part to advances in high-resolution photolithography and anisotropic plasma etching in which the directional ion etching results in essentially bias-free replication of the photoresist image in the underlying patterned layers, such as in polysilicon and insulating oxide layers and the like.

One such circuit type where this high-resolution processing is of particular importance is the dynamic random access memory (DRAM) circuit. This DRAM circuit is used extensively in the electronics industry, and particularly in the computer industry for electrical data storage. The DRAM circuits consist of an array of individual memory cells, each cell consisting of an access transistor, usually a field effect transistor (FET), and a single storage capacitor. Information is stored on the cell as charge on the capacitor, which represents a unit of data (bit), and is accessed by read/write circuits on the periphery of the DRAM chip. After the year 2000 the number of these cells on a DRAM chip is expected to exceed a gigabit. To achieve this high density and still maintain a reasonable chip size, the individual cells on the chip must be significantly reduced in size. As these individual memory cells decrease in size, so must the area on the cell that the storage capacitor occupies. The reduction in the storage capacitor size makes it difficult to store sufficient charge on the capacitor to maintain an acceptable signal-to-noise level, and circuits require shorter refresh cycle times to retain the necessary charge level. One method of overcoming this size problem is to build stacked capacitors that extend vertically over the cell areas to increase the electrode capacitor area while confining the capacitor within the cell area.

However, as the minimum feature sizes decrease to less than a quarter-micrometer (0.25 um), it becomes increasing difficult to built reliable stacked capacitors without increasing process complexity and manufacturing cost. One process complexity is the need to etch contact holes in insulators with increasing aspect ratios (depth/width). It is difficult to etch these deep holes without over-etching that damages the substrate causing excessive junction leakage at the capacitor node contact.

For these submicrometer devices it is also important to provide planar surfaces to facilitate the formation of high resolution photoresist etch masks that require a more shallow depth of focus (DOF) during the photoresist exposure. Planar surfaces are also required because of the very directional etching, since patterning layers, such as polysilicon and metals, by directional etching can otherwise result in unwanted residue at steps (recesses) on non-planar surfaces. However, planarizing process, such as chemical-mechanical polishing or planarizing etch backs, are time consuming and costly. Therefore it is desirable to minimize the number of planarizing steps and to reduce the aspect ratio for contact holes on DRAM circuits.

Numerous methods of making DRAM circuits with stacked capacitors having increased capacitance have been reported in the literature. The following U.S. patents describe several methods for making stacked capacitors. Wang et al. in U.S. Pat. No. 5,702,989 describe a method for making a DRAM using a single polysilicon plug as the capacitor node contact and also serves as a center column in the capacitor to increase capacitance. However, this single plug requires etching very deep contact contacts with very high aspect ratios (depth/width) and is difficult to achieve without excessive over etching in the insulating layer. Another approach is described by Chao in U.S. Pat. No. 5,863,821 in which a contact hole is etched through a multilayer to the substrate. This is also difficult to achieve without over-etching. Tseng in U.S. Pat. Nos. 5,854,105 and 5,843,821 describe methods for making DRAMs with single polysilicon plugs in a planar insulating on which are fabricated stacked capacitors. However, further process would require an insulating layer over the capacitors that would need to be planarized. In U.S. Pat. No. 5,888,865 Lin describes a method for making a DRAM capacitor using a single polysilicon plug that also serves as a portion of the stacked capacitor. However, Lin etches contact holes through a relatively thick multilayer to the substrate which can result in over-etch and substrate damage (leakage currents).

However, there is still a need to improve the fabrication of DRAM devices with high capacitance for future product generation below the 0.25 um feature sizes and to make the process more manufacturable and cost effective.

SUMMARY OF THE INVENTION

It is a principal object of the present invention to provide a method for fabricating DRAM memory cells with stacked capacitors having increased capacitance that are more manufacturable and cost effective.

It is another object of this invention to achieve the principal object above by using an additional second (upper) polysilicon plug, as a pillar, that is aligned over a first (bottom) polysilicon plug used as the capacitor node contact. The use of two polysilicon plug reduces the etch depth of the contact openings for better control when making sub-quarter micrometer (<0.25 um) DRAM product. This additional pillar also results in increased capacitor height (increased capacitance) with excellent capacitance control while avoiding plasma etch damage to the substrate in the node contact openings.

It is still another object of this invention to use this additional upper polysilicon plug to independently optimize the total surface area for capacitor enhancement of future product generation beyond 0.25 um without the need to alter (disturb) the underlying DRAM structure.

The above objects of this invention are achieve by first providing a semiconductor substrate (wafer) composed of single crystalline silicon. A field oxide is formed in and on the substrate surrounding and electrically isolating an array of device areas in which are formed the semi-conductor devices. The most commonly used devices are field effect transistors (FETs). For high density circuits a more advanced field oxide isolation is utilizes, commonly referred to a shallow trench isolation (STI). The STI is formed by etching a shallow trench in the silicon substrate and filling the trench with an insulating material, such as a chemical vapor deposited (CVD) silicon oxide ($SiO_2$). The $SiO_2$ is polished or etched back to form a STI that is planar with the substrate surface. The FETs are formed by first forming a thin gate oxide on the device areas. A conductively doped polysilicon layer and a silicide layer are deposited to form a polycide layer. The polycide layer is then patterned to form word lines for the DRAM cells, and portions of the patterned polycide extend over the device areas and serve as the FET gate electrodes. Concurrently the patterned polycide layer also serves as local inter-connection for the peripheral circuits on the DRAM chip. Lightly doped drains (LDDs) are formed next in the substrate adjacent to the gate electrodes, usually by ion implantation, and sidewall spacers are formed on the gate electrodes by depositing and blanket etching back an insulating layer, such as $SiO_2$ or $SiO_2$ and $Si_3N_4$. After the LDDs and sidewall spacers are formed, the FETs in the peripheral circuits are completed by forming heavily doped source/drain contact regions adjacent to the sidewall spacer to provide low contact resistance.

Continuing with the process, the improved stacked capacitors are now fabricated. A first insulating layer is deposited on the substrate, and is planarized. The first insulating layer is a silicon oxide ($SiO_2$) or a doped oxide such as a borophosphosilicate glass (BPSG). First contact openings are etched in the first insulating layer to the source/drain areas in the DRAM cells for the capacitor node contacts and bit line contact. A first polysilicon plugs are formed in the first openings for capacitor node contact and bit line contact by depositing an in situ doped poly-silicon layer and etching back or chemical-mechanical polishing back to the surface of the first insulating layer. A blanket etch stop layer, such as $Si_3N_4$, is deposited on the first insulating layer and over the first polysilicon plugs. A relatively thick second insulating layer is then deposited on the etch stop layer.

Referring now more specifically to the method of this invention, second contact openings are etched in the second insulating layer and the etch stop layer to the first polysilicon plugs in the capacitor node contact openings. A conductively doped polysilicon layer is deposited and etched back or polished back to the second insulating layer to form second polysilicon plugs in the second contact openings. Next, a photoresist etch mask and anisotropic plasma etching are used to etch openings for capacitors in the second insulating layer and the etch stop layer. These openings are aligned over and are wider than the second polysilicon plugs. These openings, hereafter referred to as capacitor openings, result in a recesses having free standing second polysilicon plugs that form center pillars for the stacked capacitors. By including this second polysilicon plug it is possible to eliminate the need to etching deep-high aspect ratio contact openings to the substrate, that would otherwise result in over-etch damage to the shallow diffused junctions in the substrate. Also the capacitor height can be independently and more accurately controlled. The etch stop layer allows the second contact openings and the capacitor openings be etched accurately to the first polysilicon plug without over etching the underlying first insulating layer. The capacitor openings can be redesigned to tailored the capacitors for future sub-quarter micrometer (<0.25 um) product without affecting the underlying DRAM structure. Continuing with the process, a conformal in situ doped first polysilicon layer is deposited and polishing back to the top surface of the second insulating layer to form the capacitor bottom electrodes in the capacitor openings having a pillar formed from the second polysilicon plug to increase capacitance. To further increase capacitance a hemispherical silicon grain (HSG) layer is formed on the bottom electrode. A relatively thin interelectrode dielectric layer having a high dielectric constant is then formed on the bottom electrode. A doped second polysilicon layer is deposited sufficiently thick to fill the remaining spaces in the capacitor openings and is patterned to form capacitor top electrodes and complete the stacked capacitors. The DRAM device (circuits) are now completed to the first level of electrical interconnections. A third insulating layer, such as $SiO_2$, is deposited. Via holes are etched in the third insulating layer to the device areas of the peripheral circuits, to the bit line contact plugs (first polysilicon plugs), and to the capacitor top electrodes. A metal plug is formed in the via holes by depositing a metal, such tungsten (W), and chemical-mechanical polishing back the W to the third insulating layer. A first metal, such as an aluminum/copper (Al/Cu) alloy, is deposited and patterned to form the first level of interconnections for the DRAM devices. Although the method is described for DRAM devices, these capacitors can be made for merged DRAM/logic circuits.

BRIEF DESCRIPTION OF THE DRAWINGS

The objects and other advantages of this invention are best understood with reference to the attached drawing and embodiment that follows.

DESCRIPTION OF THE PREFERRED EMBODIMENTS

Now in keeping with the objects of the invention, the method for forming a DRAM stacked capacitor using two polysilicon plugs is covered in detail. These DRAM devices with improved capacitors can be fabricated using FET structures that are currently utilized in the manufacture of DRAMs. Therefore, only those details of the underlying substrate structure will be described that are necessary for understanding the current invention. It should also be well understood by those skilled in the art that by including additional processing steps, other types of devices can also be included on the DRAM chip. For example, by providing N and P doped wells, both P-channel and N-channel FETs can be formed for fabricating CMOS circuits, as are commonly used in the peripheral circuits of the DRAM chip. Further the process is applicable to embedding (or merging) these DRAM devices with logic circuits.

Figure 1:
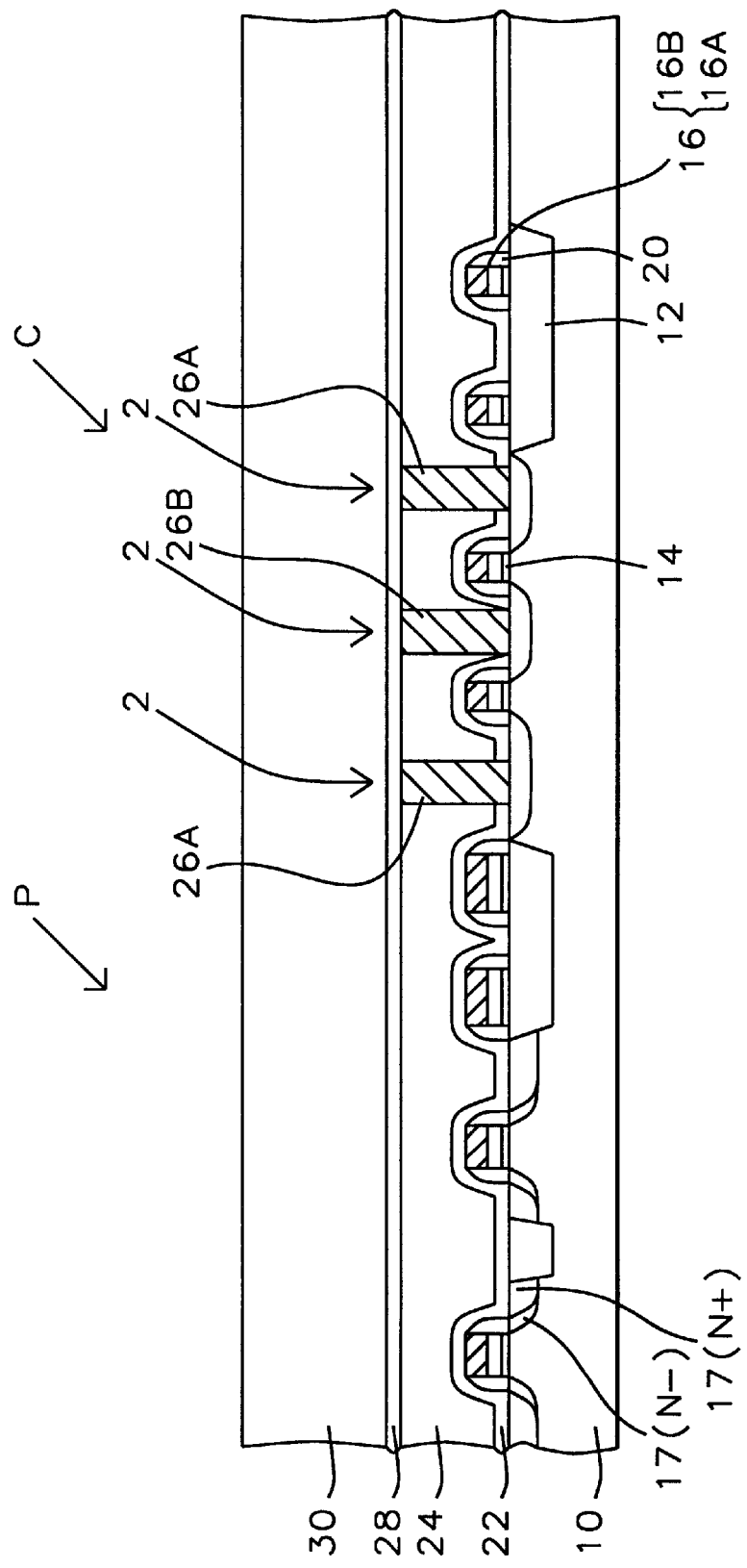
FIGS. 1,2,3,4,5,6 and 7 show schematic cross-sectional views through a portion of the DRAM device having an array of memory cells depicting the sequence of process steps for forming the stacked capacitors with two polysilicon plug by the method of this invention.

Referring now to FIG. 1, a cross-sectional view is shown of a portion of a semiconductor substrate 10 having a partially completed DRAM cell . A portion of the peripheral circuits of the DRAM device is depicted in the left side of the figures, and is labeled P, and the portion of the memory cell is depicted on the right side of the figures and labeled C. The semiconductor substrate 10 commonly used in the industry is composed of a P-type single-crystal silicon having a <100> crystallographic orientation. A relatively thick Field OXide 12 (FOX) is used to surround and electrically isolate the device areas. Typically for the more advanced high density circuits, the most commonly used field oxide in the industry is a shallow trench isolation (STI). Briefly, the method for making the STI 12 consist of etching shallow trenches in the field oxide regions while using a patterned stress-release oxide (pad oxide) layer and a thicker hard mask layer to protect the devices areas. The pad oxide is typically a thermal silicon oxide ($SiO_2$) and the hard mask is a silicon nitride ($Si_3N_4$) layer. The trenches are typically etched to a depth of about 2000 and 5000 Angstroms using for example anisotropic plasma etching. After cleaning and growing a good thermal oxide on the trench surface, an insulating layer, such as a chemical vapor deposited $SiO_2$ (CVD-$SiO_2$) is deposited on the substrate and chemical-mechanical polished back to the hard mask. The hard mask and pad oxide (not shown in FIG. 1) are then removed to leave the STI 12 in the trenches essentially planar with the substrate surface, as depicted in FIG. 1.

Continuing in FIG. 1, The field effect transistors (FETs) are fabricated next in and on the device areas for the DRAM cell, the typical transistor used is the N-channel FET and is now briefly described. The silicon surface is carefully cleaned, and a good quality thermal oxide is grown to form the gate oxide 14. Only the portion of the gate oxide 14 that remains after further process is shown under the gate electrodes. Typically the gate oxide is grown to a thickness of between about 30 and 100 Angstroms. The gate electrodes 16 are formed next from a patterned polycide (polysilicon and silicide) layer 16. The polycide layer is composed of a doped polysilicon layer 16A and a refractory metal silicide layer 16B. The top polycide layer 16B is included to increase the electrical conductivity and improve circuit performance. The polysilicon layer 16A is typically deposited by low-pressure chemical vapor deposition (LPCVD) using, for example, silane ($SiH_4$) as the reactant gas. The polysilicon is then appropriately doped by ion implantation to increase the electrical conductivity, and usually is doped with arsenic (As) or phosphorus (P) to a dopant concentration of between about $1.0 E 15$ and $1.0 E 16$ atoms/$cm^3$. The silicide 16B is typically a refractory metal silicide, such as tungsten silicide ($WSi_2$), and is usually deposited by CVD using a reactant gas mixture such tungsten hexafluoride ($WF_6$) and silane ($SiH_4$) and is deposited to a thickness of between about 500 and 1500 Angstroms. The polycide layer 16 (layers 16A and 16B) is then patterned using conventional photolithographic techniques and anisotropic plasma etching to form the gate electrodes 16 over the device areas. Portions of the patterned polycide layer are also used as local interconnections over the STI 12 regions which include the word lines for the cell areas, as shown in FIG. 1.

Next, lightly doped source/drain regions 17($N^-$) are formed adjacent to the gate electrodes 16 usually by implanting a N-type dopant, such as arsenic or phosphorus. For example, a typical implant might consist of a phosphorus $P^{31}$ at a dose of between about $1.0 E 13$ and $1.0 E 14$ atoms/$cm^2$ and with an ion energy of between about 15 to 50 Kev. As is commonly used in the semiconductor industry a photolithographic mask can be used to avoid implanting in areas not requiring the implant.

After forming the lightly doped source/drain areas 17($N^{31}$), sidewall spacers 20 are formed on the gate electrodes 16. The spacers 20 are formed by depositing a conformal blanket $SiO_2$ layer, and anisotropically etching back to the substrate surface. For example, the $SiO_2$ can be deposited by chemical vapor deposition using tetra-ethosiloxane (TEOS) at a temperature in the range of between about 650 and 900° C., and the etchback can be accomplished using reactive ion etching (RIE) and an appropriate etchant gas such as carbon tetrafluoride ($CF_4$) and hydrogen ($H_2$). The FETs are now completed by forming heavily doped source/drain contact areas 19($N^+$), as shown in FIG. 1. For example, arsenic ($As^{75}$) can be implanted to achieve a final dopant concentration of between about $1.0 E 19$ and $1.0 E 20$ atoms/$cm^3$. Next a barrier layer 22 is deposited which also serves as an etch-stop layer. Typically layer 22 is $Si_3N_4$ and is deposited by low pressure CVD (LPCVD) to a thickness of between about 100 and 500 Angstroms.

Still referring to FIG. 1, and continuing with the process the capacitors are made next. A first insulating layer 24 is deposited on the substrate and planarized. The first insulating layer 24 provides electrically insulation over the FET devices on the substrate 10 and provides a base to supports the capacitors. Layer 24 is preferably a silicon oxide ($SiO_2$) and is deposited using LPCVD and a reactant gas such as tetraethosiloxane (TEOS) or TEOS and ozone. Alternatively, layer 24 can be a doped oxide, such as a borophosphosilicate glass (BPSG) deposited by LPCVD using TEOS, and is doped with boron and phosphorus during the silicon oxide deposition. The first insulating layer 24 is then planarized. For example, layer 24 can be planarized using chemical/mechanical polishing (CMP) to provide global planarization. The thickness of layer 24 after planarizing is preferably between about 3000 and 6000 Angstroms over the underlying FET gate electrodes 16. Conventional photolithographic techniques and anisotropic plasma etching are used to etch first contact openings 2 in the first insulating layer 24 and in the barrier layer 22. The openings 2 are etched aligned over and to the source/drain contact region 17(N) in each of the memory cell device areas (portion C) for the capacitor node contacts and bit line contacts. A polysilicon layer 26 is deposited and polished back to the surface of the first insulating layer 24 to form first polysilicon plugs 26A for the capacitor node contacts and first polysilicon 26B for the bit line contacts. The polysilicon layer 26 is preferably deposited by LPCVD using for example silane ($SiH_4$) as the reactant gas and is deposited to a thickness sufficient to fill the openings 2. The polysilicon layer 26 is doped in situ during deposition using phosphine ($PH_3$) as the dopant gas, and layer 26 is doped to a preferred concentration of between about $1.0 E 19$ and $1.0 E 21$ atoms/$cm^3$. The layer 26 is then chemical-mechanical polished back to form the polysilicon plugs 26A and 26B in openings 2.

Next, as shown in FIG. 1, A blanket etch stop layer 28 is deposited on the first insulating layer 24 and over the first polysilicon plugs 26A and 26B. Layer 28 is preferably composed of silicon nitride ($Si_3N_4$), and is deposited by LPCVD using a reactant gas mixture such as dichlorosilane ($SiCl_2H_2$) and ammonia ($NH_3$). The preferred thickness of layer 28 is between about 100 and 500 Angstroms. A second insulating layer 30 is deposited on the etch-stop layer 28. Layer 30 is also composed of $SiO_2$ or BPSG, and is deposited by LPCVD to a preferred thickness of between about 5000 and 10000 Angstroms that will determine the height H of the stacked capacitor.

Figure 2:
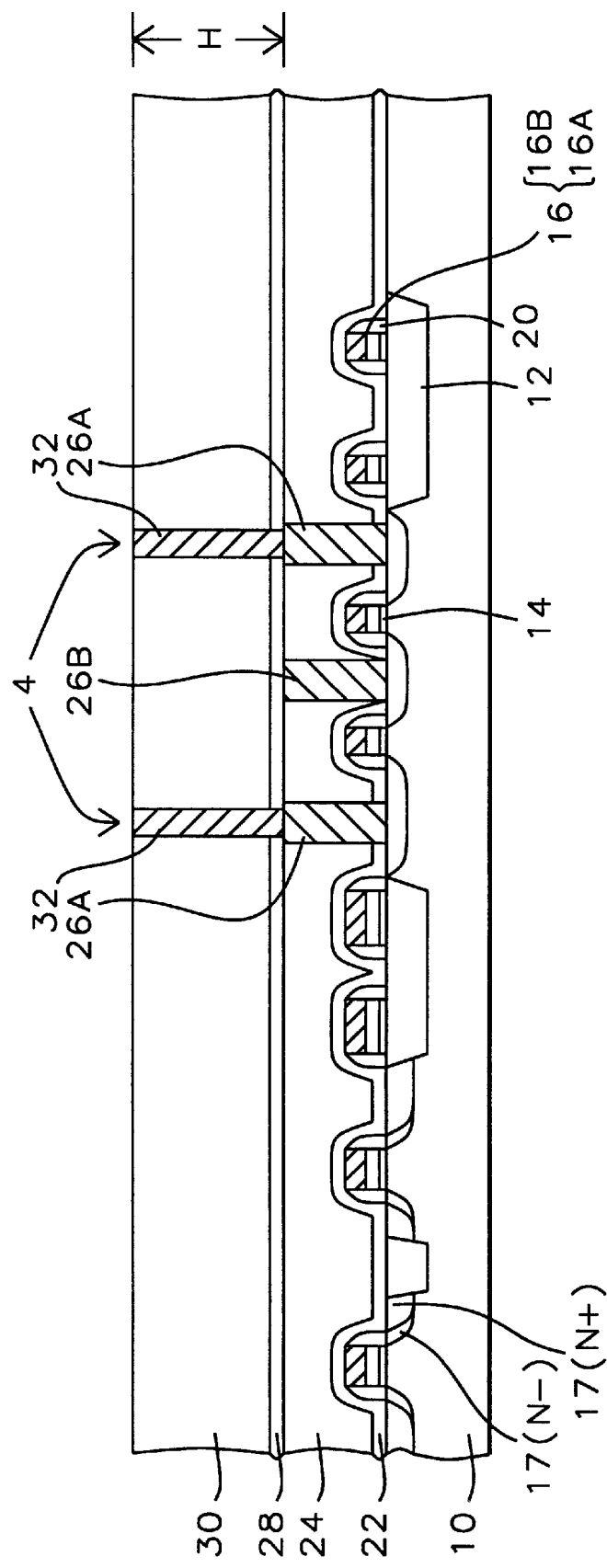

Referring now to FIG. 2, and more specifically to the method of this invention, a photoresist etch mask and plasma etching is used to etch second contact openings 4 in the second insulating layer 30 selectively to the etch stop layer 28. The openings 4 are aligned over the capacitor node contact plugs 26A. The etching is preferably carried out using RIE or a high density plasma etching and an etchant gas mixture, such as $C_2F_6$, $C_4F_8$ and $CH_2F_2$, which etches $SiO_2$ to $Si_3N_4$ having an etch selectivity of greater than about 20:1. This allows the thick second insulating layer 30 to be over etched at the $Si_3N_4$ layer 26 without significant over etching of the underlying structure (first insulating layers 24 or polysilicon plugs 26A). The thinner etch stop layer 28 can then be etched to the first polysilicon plugs 26A in the capacitor node contact openings 4, without significant over etching. For example, the $Si_3N_4$ layer can be etched using RIE and a etchant gas mixture, such as $CH_2F_2$ and $O_2$.

Still referring to FIG. 2, a conductively doped polysilicon layer 32 is deposited and plasma etched back or polished back to the second insulating layer 30 to form second polysilicon plugs 32 in the second contact openings 4. Since these capacitor node contacts are formed in two etch steps (contact openings 2 and 4) the aspect ratio of each etched hole is significantly reduced, and is easier and more reliably to form sub-quarter micrometer (<0.25 um) devices. The second polysilicon plug also services as a center pillar for the stacked capacitor to further increase capacitance, as will soon become apparent.

Figure 3:
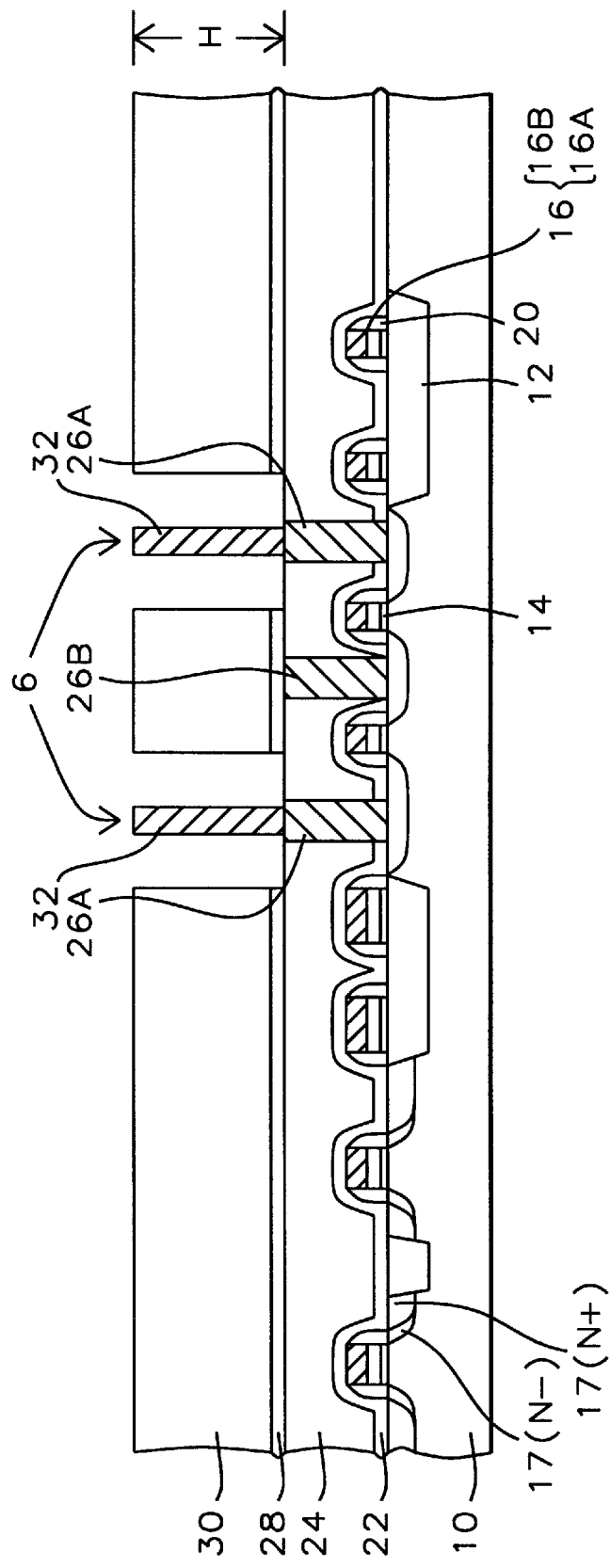

Referring to FIG. 3, conventional photolithographic techniques and anisotropic plasma etching are use to selectively etch openings 6 in the second insulating layer 30 to the etch stop layer 28. The openings 6 are aligned over and are wider than the second polysilicon plug 32 The exposed etch-stop layer 28 in the openings 6 is then etched to the first insulating layer 24 and polysilicon plugs 26A. The etching is similar to method used for etching the openings 4 above, and therefore are etched without significant over-etching. These openings 6, referred to as capacitor openings, result in a recesses having free standing second polysilicon plugs 32 that form center pillars for the stacked capacitors. Since the capacitor height H is determined by the thickness of the second insulating layer 30 and etch stop layer 28 the capacitance can be accurately controlled. Since the width of the capacitor openings 6 and the width of second polysilicon plug 32 can be more accurately controlled, the capacitance can be tailored for each succeeding product generation after the 0.25 um generation. These advanced capacitor structures can be achieved without adversely affecting the underlying DRAM structure.

Figure 4:
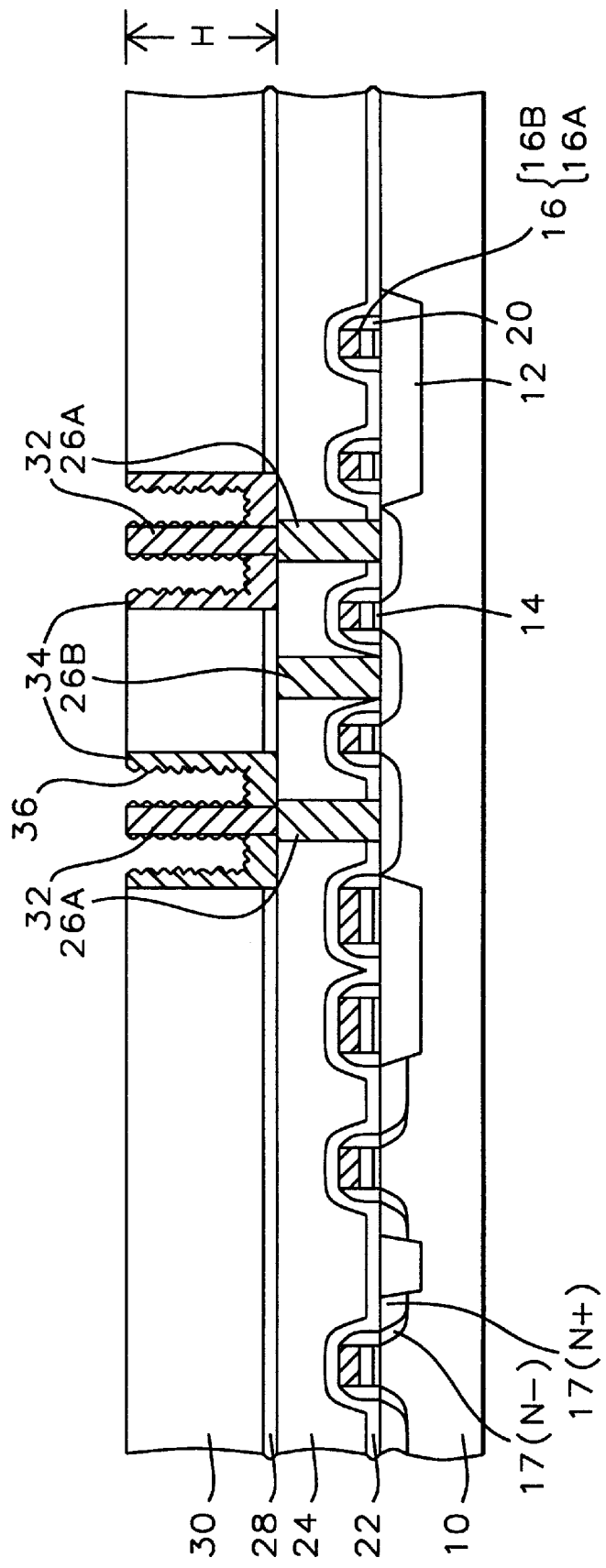

Referring to FIG. 4, an situ doped conformal first polysilicon layer 34 is deposited and polishing back to the top surface of the second insulating layer 30 to form the capacitor bottom electrodes 34 in the capacitor openings 6. The polysilicon layer 34 is deposited using LPCVD and silane and is deposited to a thickness of between about 500 and 1000 Angstroms. The polysilicon layer 34 is preferably doped in situ by adding a dopant gas, such as phosphine ($PH_3$) during the LPCVD deposition, and is doped to a preferred concentration of between 1.0 E 19 and 1.0 E 21 atoms/$cm^3$. To further increase the capacitance the layer 34 can be roughened, for example by forming a Hemispherical Silicon Grain (HSG) surface on layer 34. Still referring to FIG. 4, a thin interelectrode dielectric layer 36 (not shown as a separate layer) is formed on the surface of the capacitor bottom electrode 34. The thin dielectric layer 36 has a thickness preferably equal to an effective silicon oxide thickness of between about 40 and 50 Angstroms, and is composed of a material having a high dielectric constant that is compatible with the polysilicon processing, and is continuous and essentially pinhole free. One of the preferred interelectrode dielectric layer is composed of silicon oxide-silicon nitride (ON) or a silicon oxide-silicon nitride-silicon oxide (ONO) layer. For example, the surface of the polysilicon bottom electrode can be thermally oxidized to form the silicon oxide, and then a thin conformal silicon nitride layer can be deposited using LPCVD to form the ON layer. To form the ONO layer, the exposed surface of the $Si_3N_4$ layer can then be reduced in an oxidizing ambient at elevated temperatures.

Figure 5:
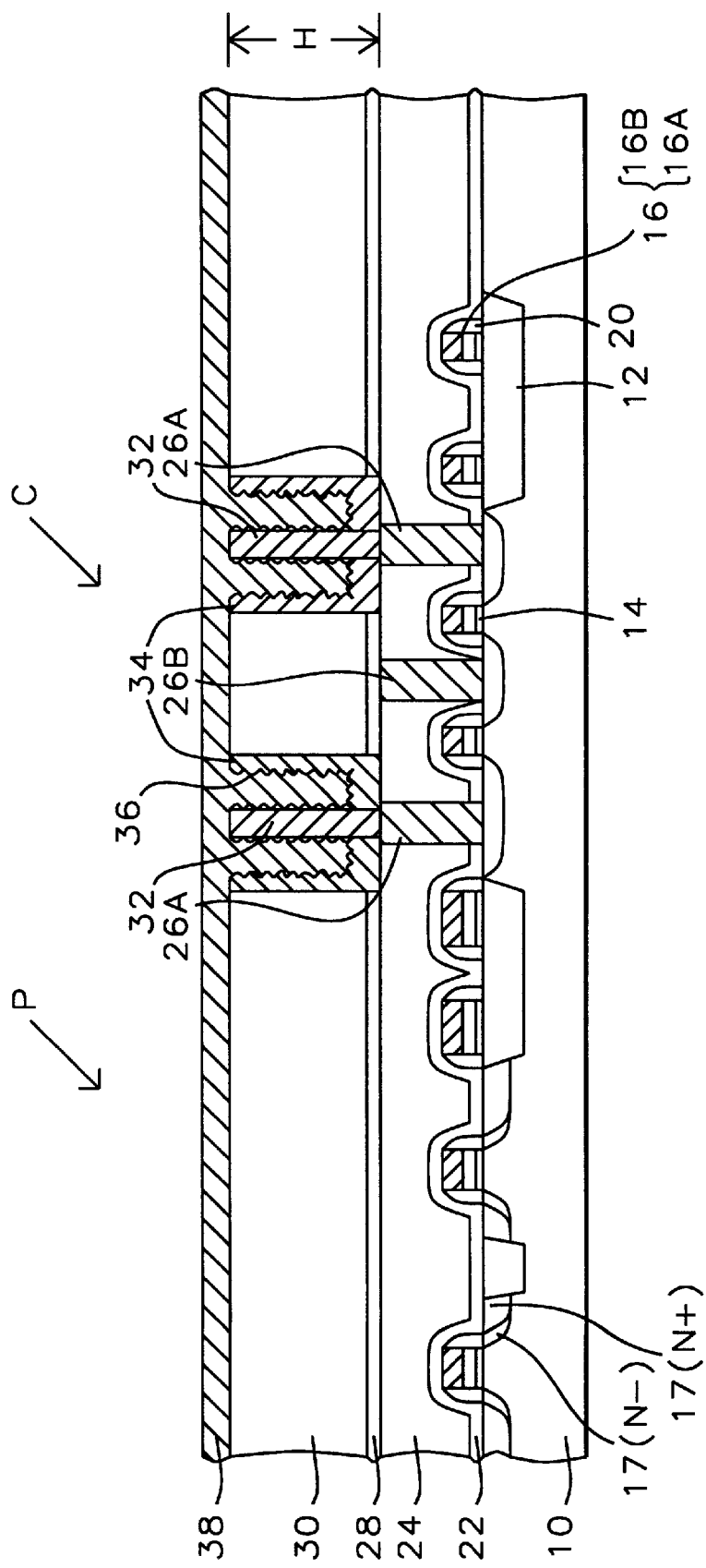
Figure 6:
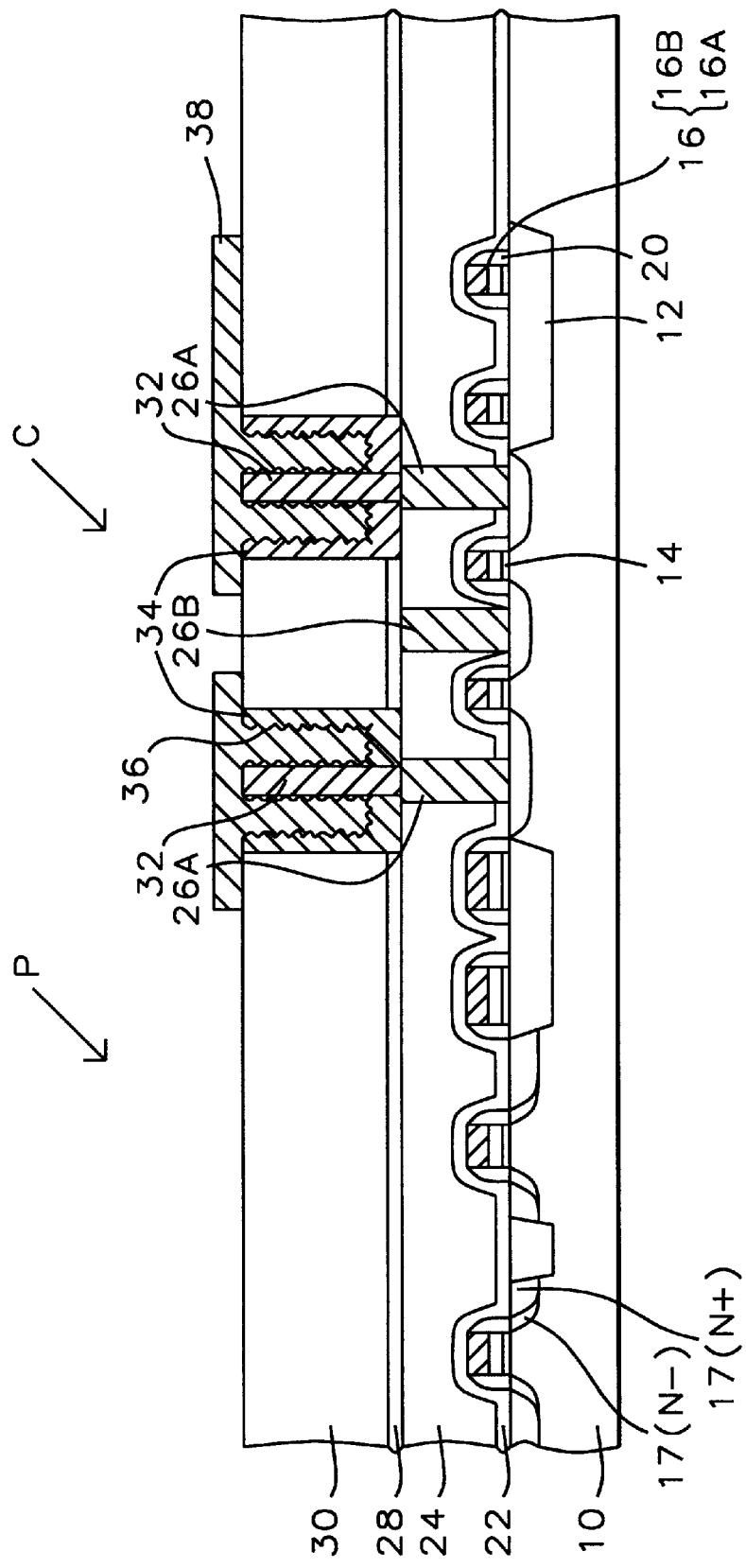

As shown in FIG. 5, a doped second polysilicon layer 38 is deposited to form capacitor top electrodes. The second polysilicon layer 38 is deposited by LPCVD similar to the first polysilicon layer 34, but to a thickness sufficient to fill the remaining space in the openings 6 between the sidewalls 34 and the pillars 32, and more specifically to a thickness of between about 800 and 1000 Angstroms. Conventional photolithographic techniques and plasma etching are used to pattern the capacitor top electrodes, as depicted in FIG. 6

Figure 7:
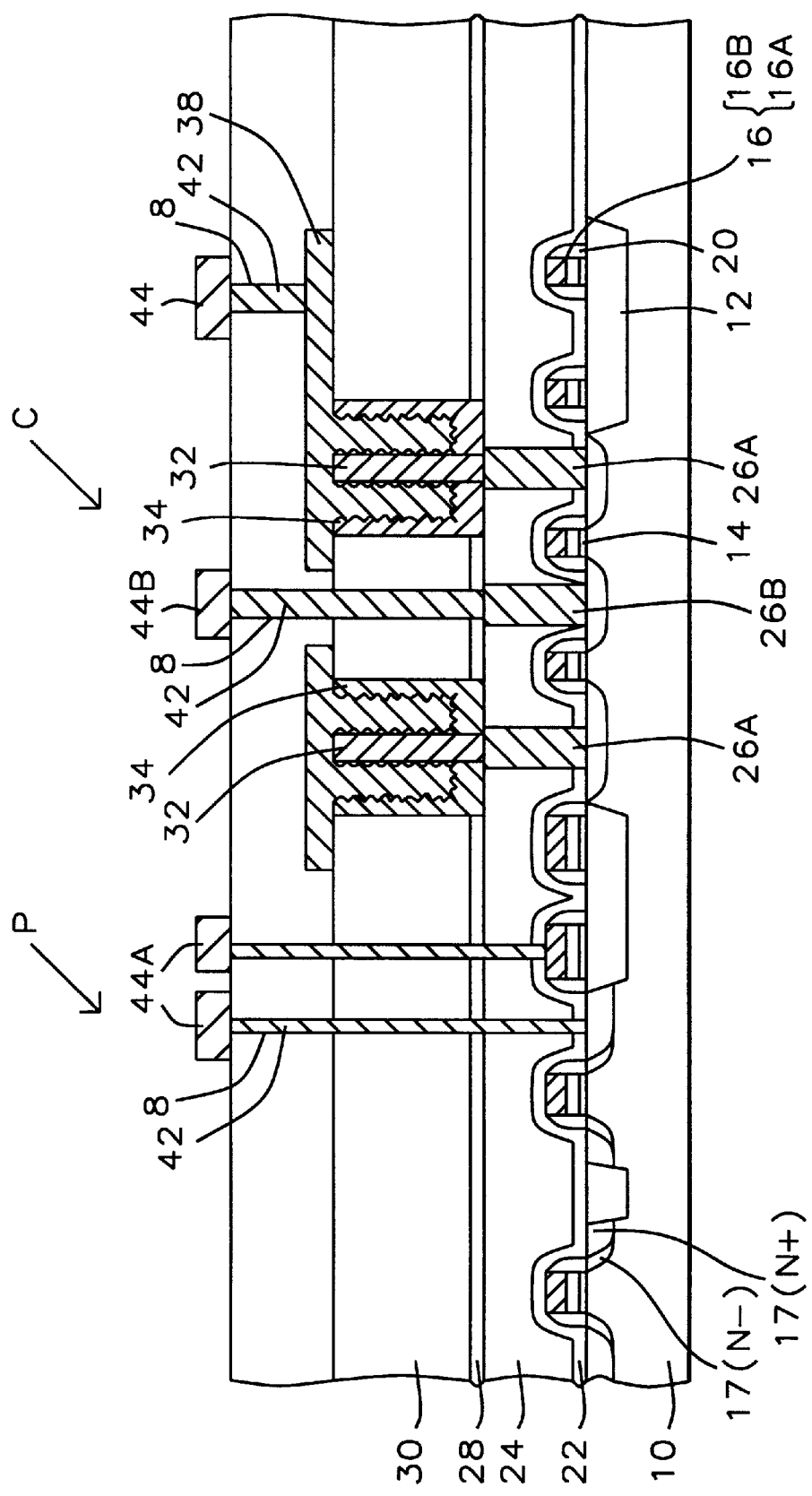

The DRAM device (circuits) are now completed to the first level of electrical interconnections, as shown in FIG. 7. A third insulating layer 40 is deposited to electrically insulated the top electrodes 38. Layer 40 is preferably a LPCVD $SiO_2$, and is deposited to a thickness of between about 3000 and 5000 Angstroms. Via holes 8 are etched in the third insulating layer 40 to the source/drain contact areas device areas in the peripheral portions, to the bit line first polysilicon plugs (landing plugs) 26B, and to the capacitor top electrodes 38 in the cell portions C. Metal plugs is formed in the via holes 8 by depositing a metal 42, such tungsten (W) and chemical-mechanical polishing the W to the third insulating layer 40. Typically, the tungsten 42 is deposited by CVD using $WF_6$ as the reactant. A first metal, such as an aluminum/copper (Al/Cu) alloy 44 is deposited. The Al/Cu can be deposited by physical vapor deposition (PVD), such as by sputter deposition from an Al/Cu target, and is typically deposited to a thickness of between about 4000 and 6000 Angstroms. A photoresist mask (not shown) and anisotropic plasma etching are used to pattern the first level metal 44 to form the local interconnection 44A for the peripheral circuits C, and the bit lines 44B. Although the method is described for DRAM devices, these capacitors can also be made for merged DRAM/logic circuits.

While the invention has been particularly shown and described with reference to the preferred embodiment thereof, it will be understood by those skilled in the art that various changes in form and detail may be made without departing from the spirit and scope of the invention.

What is claimed is:

1. A method for fabricating DRAM stacked capacitors for memory devices having second polysilicon plugs, comprising the steps of:

providing a semiconductor substrate having device areas with semiconductor devices with capacitor node contact areas;

forming a planar first insulating layer over said device areas on said substrate;

etching first contact openings in said first insulating layer which include openings over and to said capacitor node contact areas;

forming first polysilicon plugs in said openings;

depositing a blanket etch stop layer on said first insulating layer and over said first polysilicon plugs;

depositing a second insulating layer on said etch stop layer;

etching second contact openings in said second insulating and said etch stop layer to said first polysilicon plugs for said capacitor node contacts;

forming second polysilicon plugs in said second contact openings;

etching capacitor openings in said second insulating layer and said etch stop layer, said capacitor openings aligned over and wider than said second polysilicon plugs, whereby said second polysilicon plugs form center pillars for said stacked capacitors;

depositing a conformal first polysilicon layer and polishing back to said second insulating layer to form capacitor bottom electrodes in said capacitor openings forming a capacitor dielectric layer;

depositing and patterning a second polysilicon layer to form capacitor top electrodes and thereby forming said stacked capacitors having said second polysilicon plug.

2. The method of claim 1, wherein said planar first insulating layer is silicon oxide, and has a thickness over said semiconductor devices of between about 3000 and 6000 Angstroms.

3. The method of claim 1, wherein said first and second polysilicon plugs are formed by depositing a polysilicon layer conductively doped with phosphors to a concentration of between about 1.0 E 19 and 1.0 E 21 atoms/cm$^3$, and is chemical-mechanical polished back to said first insulating layer.

4. The method of claim 1, wherein said etch-stop layer is a silicon nitride layer, and has a thickness in the range between about 100 and 500 Angstroms.

5. The method of claim 1, wherein said second insulating layer is silicon oxide, and has a thickness of between about 5000 and 10000 Angstroms.

6. The method of claim 1, wherein said conformal first polysilicon layer is deposited to a thickness of between about 1000 and 2000 Angstroms and is conductive doped with phosphorus to a concentration of between about 1.0 E 19 and 1.0 E 21 atoms/cm$^3$.

7. The method of claim 1, wherein said capacitor dielectric layer is a silicon oxide-silicon nitride-silicon oxide (ONO) layer and has a thickness equal to an effective silicon dioxide thickness of between about 40 and 50 Angstroms.

8. The method of claim 1, wherein said second polysilicon layer is conductively doped with phosphorus to a concentration of between about 1.0 E 19 and 1.0 E 21 atoms/cm$^3$, and has a thickness of between about 500 and 1000 Angstroms.

9. A method for fabricating DRAM devices having stacked capacitors with second polysilicon plugs, comprising the steps of:

providing a semiconductor substrate having device areas with semiconductor devices and having capacitor node contact areas and bit line contact areas;

forming a planar first insulating layer over said device areas on said substrate;

etching first contact openings in said first insulating layer which include openings over and to said capacitor node contact areas and said bit line contact openings;

forming first polysilicon plugs in said capacitor node contact openings and in said bit line contact openings;

depositing a blanket etch stop layer on said first insulating layer and over said first polysilicon plugs;

depositing a second insulating layer on said etch stop layer;

etching second contact openings in said second insulating and said etch stop layer to said first polysilicon plugs in said capacitor node contact openings;

forming second polysilicon plugs in said second contact openings;

etching capacitor openings in said second insulating layer and said etch stop layer, said capacitor openings aligned over and wider than said second polysilicon plugs, whereby said second polysilicon plugs form center pillars for said stacked capacitors;

depositing a conformal first polysilicon layer and polishing back to said second insulating layer to form capacitor bottom electrodes in said capacitor openings forming a capacitor dielectric layer;

depositing and patterning a second polysilicon layer to form capacitor top electrodes and thereby forming said stacked capacitors having said second polysilicon plug;

depositing a third insulating layer over said stacked capacitors;

etching via holes in said third insulating layer to said device areas, to said bit line polysilicon plugs, and to said capacitor top electrodes and filling said via holes with a refractory metal;

depositing and patterning a first metal to form first level of interconnections for said DRAM devices.

10. The method of claim 9, wherein said planar first insulating layer is silicon oxide, and has a thickness over said semiconductor devices of between about 3000 and 6000 Angstroms.

11. The method of claim 9, wherein said first and second polysilicon plugs are formed by depositing a polysilicon layer conductively doped with phosphors to a concentration of between about 1.0 E 19 and 1.0 E 21 atoms/cm$^3$, and is chemical-mechanical polished back to said first insulating layer.

12. The method of claim 9, wherein said etch-stop layer is a silicon nitride layer, and has a thickness in the range between about 100 and 500 Angstroms.

13. The method of claim 9, wherein said second insulating layer is silicon oxide, and has a thickness of between about 5000 and 10000 Angstroms.

14. The method of claim 9, wherein said conformal first polysilicon layer is deposited to a thickness of between about 1000 and 2000 Angstroms and is conductive doped with phosphorus to a concentration of between about 1.0 E 19 and 1.0 E 21 atoms/cm$^3$.

15. The method of claim 9, wherein said conformal first polysilicon layer is formed by depositing an amorphous silicon layer and annealing to form a hemispherical silicon grain (HSG) surface to increase capacitance.

16. The method of claim 9, wherein said capacitor dielectric layer is a silicon oxide-silicon nitride-silicon oxide (ONO) layer and has a thickness equal to an effective silicon dioxide thickness of between about 40 and 50 Angstroms.

17. The method of claim 9, wherein said second polysilicon layer is conductively doped with phosphorus to a concentration of between about 1.0 E 19 and 1.0 E 21 atoms/cm$^3$, and has a thickness of between about 500 and 1000 Angstroms.

18. The method of claim 9, wherein said third insulating layer is silicon oxide and is deposited by chemical vapor deposition (CVD) to a thickness of between about 3000 and 5000 Angstroms.

19. The method of claim 9, wherein said refractory metal is tungsten (W) and is deposited by chemical vapor deposition using tungsten hexafluoride (WF$_6$) as the reactant gas.

20. The method of claim 9, wherein said first metal layer is an aluminium alloy and is deposited by physical vapor deposition (PVD) to a thickness of between about 4000 and 6000 Angstroms.

21. The method of claim 9, wherein said semiconductor devices are field effect transistors.

* * * * *